United States Patent
Sakai

(10) Patent No.: US 8,859,313 B2
(45) Date of Patent: Oct. 14, 2014

(54) METHOD FOR MANUFACTURING SEMICONDUCTOR LIGHT EMITTING ELEMENT, SEMICONDUCTOR LIGHT EMITTING ELEMENT, LAMP, ELECTRONIC DEVICE AND MECHANICAL APPARATUS

(75) Inventor: Hiromitsu Sakai, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 74 days.

(21) Appl. No.: 13/582,573

(22) PCT Filed: Feb. 28, 2011

(86) PCT No.: PCT/JP2011/054483
§ 371 (c)(1), (2), (4) Date: Sep. 4, 2012

(87) PCT Pub. No.: WO2011/108484
PCT Pub. Date: Sep. 9, 2011

(65) Prior Publication Data
US 2012/0326169 A1    Dec. 27, 2012

(30) Foreign Application Priority Data
Mar. 5, 2010  (JP) ................. 2010-049628

(51) Int. Cl.
| | | |
|---|---|---|
| H01L 21/00 | (2006.01) | |
| B82Y 20/00 | (2011.01) | |
| H01L 33/00 | (2010.01) | |
| H01L 21/02 | (2006.01) | |
| H01L 33/32 | (2010.01) | |
| H01S 5/30 | (2006.01) | |
| H01S 5/343 | (2006.01) | |

(52) U.S. Cl.
CPC ............ *H01L 33/007* (2013.01); *H01L 21/0262* (2013.01); *H01L 21/02458* (2013.01); *B82Y 20/00* (2013.01); *H01L 21/02576* (2013.01); *H01L 21/0237* (2013.01); *H01L 33/325* (2013.01); *H01S 5/3054* (2013.01); *H01L 21/0254* (2013.01); *H01S 5/34333* (2013.01)

USPC ................. 438/37; 257/13; 257/19; 257/79; 257/E21.108; 257/E33.049; 438/48

(58) Field of Classification Search
USPC ............... 257/13, 19, 79, 101, 103, E33.049, 257/E21.108; 438/22, 37, 48, 604, 956
See application file for complete search history.

(56) References Cited

U.S. PATENT DOCUMENTS

| | | | |
|---|---|---|---|
| 8,569,794 B2 * | 10/2013 | Miki et al. ................. | 257/103 |
| 2008/0073657 A1 * | 3/2008 | Liang et al. ................. | 257/89 |

(Continued)

FOREIGN PATENT DOCUMENTS

| | | |
|---|---|---|
| JP | 7-45538 A | 2/1995 |
| JP | 2008-235758 A | 10/2008 |

(Continued)

OTHER PUBLICATIONS

International Search Report for PCT/JP2011/054483 dated Apr. 5, 2011.

(Continued)

*Primary Examiner* — Su Kim
(74) *Attorney, Agent, or Firm* — Sughrue Mion, PLLC

(57) ABSTRACT

A method for manufacturing a semiconductor light emitting element (1) which includes a first step of forming a first n-type semiconductor layer (12c) on a substrate (11) and a second step of sequentially forming a regrowth layer (12d) of the first n-type semiconductor layer (12c), a second n-type semiconductor layer (12b), a light emitting layer (13), and a p-type semiconductor layer (14) on the first n-type semiconductor layer (12c). In the step of forming the second n-type semiconductor layer (12b), a step (1) of supplying Si less than that forming the regrowth layer (12d) as a dopant to form a first layer of the second n-type semiconductor layer and a step (2) of supplying the Si more than that in the step (1) to form a second layer of the second n-type semiconductor layer are performed in this order.

16 Claims, 4 Drawing Sheets

(56) References Cited

U.S. PATENT DOCUMENTS

2009/0194784 A1 8/2009 Kaji et al.
2009/0286342 A1 11/2009 Takahashi et al.

FOREIGN PATENT DOCUMENTS

| | | |
|---|---|---|
| JP | 2009-123718 A | 6/2009 |
| JP | 2011-18852 A | 1/2011 |
| JP | 2011-23482 A | 2/2011 |
| TW | 200834670 A | 8/2008 |
| TW | 200834990 A | 8/2008 |
| TW | 200838000 A | 9/2008 |
| TW | 200901513 A | 1/2009 |

OTHER PUBLICATIONS

Notice of Allowance with a mailing date of Jun. 4, 2013 for copending Japanese Patent Application No. 2010-049628.
Communication dated May 14, 2014 from the Taiwan Patent Office in counterpart Taiwan Patent Application No. 100106795.

* cited by examiner

METHOD FOR MANUFACTURING SEMICONDUCTOR LIGHT EMITTING ELEMENT, SEMICONDUCTOR LIGHT EMITTING ELEMENT, LAMP, ELECTRONIC DEVICE AND MECHANICAL APPARATUS

TECHNICAL FIELD

The present invention relates to a method for manufacturing a semiconductor light emitting element, a semiconductor light emitting element, a lamp, an electronic device, and a mechanical apparatus, and more particularly, to a method for manufacturing a semiconductor light emitting element which is suitable when a large current is applied and applies a large current to obtain high light emission power, and a lamp, an electronic device, and a mechanical apparatus including the semiconductor light emitting element manufactured by the manufacturing method.

This application is a National Stage of International Application No. PCT/JP2011/054483 filed Feb. 28, 2011, which claims priority from Japanese Patent Application No. 2010-049628, filed Mar. 5, 2010, the content of which is incorporated herein by reference.

BACKGROUND ART

A semiconductor light emitting element which is used in, for example, a light emitting diode has been proposed. In the semiconductor light emitting element, an n-type semiconductor layer, a light emitting layer, and a p-type semiconductor layer are sequentially formed on a substrate. As a method for manufacturing the semiconductor light emitting element, there is a method which continuously forms an n-type semiconductor layer, a light emitting layer, and a p-type semiconductor layer on a substrate made of, for example, a sapphire single crystal in this order using a metal organic chemical vapor deposition method (MOCVD method).

However, when the n-type semiconductor layer, the light emitting layer, and the p-type semiconductor layer are continuously formed on the substrate in this order, a dopant used to form the n-type semiconductor layer hinders the formation of the p-type semiconductor layer since these layers are formed in the same growth chamber. As a result, in some cases, the p-type semiconductor layer with sufficiently low resistivity is not obtained.

As a technique for solving the above-mentioned problem, for example, Patent Document 1 discloses a method for manufacturing a compound semiconductor device in which, when at least a first-conduction-type semiconductor layer and a second-conduction-type semiconductor layer are sequentially formed on a predetermined substrate to manufacture a compound semiconductor device, the first-conduction-type semiconductor layer and the second-conduction-type semiconductor layer are formed in a plurality of independent growth chambers corresponding to the conduction types.

In addition, in recent years, in order to improve the light emission power of the semiconductor light emitting element, in many cases, a large current has been applied to the semiconductor light emitting element. Therefore, a semiconductor light emitting element is required which is capable of withstanding these conditions and has good light emission characteristics.

[Patent Document 1] Japanese Unexamined Patent Application Publication No. 7-45538

DISCLOSURE OF INVENTION

However, when the growth chamber for forming the n-type semiconductor layer and the growth chamber for forming the p-type semiconductor layer are separately provided, in some cases, the output of the obtained semiconductor light emitting element is insufficient.

When a GaN underlayer and an n-type GaN contact layer (first n-type semiconductor layer) are formed on the substrate made of, for example, a sapphire single crystal in a first growth chamber with a buffer layer interposed therebetween and an n-type GaN contact layer (a regrowth layer of the first n-type semiconductor layer or simply a regrowth layer) is formed thereon in a second growth chamber, in many cases, the flatness of the surface of the regrowth layer is reduced.

When an n cladding layer is formed, it is necessary to dope Si as a dopant. In this case, the layer needs to be formed at a low temperature (700° C. to 800° C.). Therefore, the crystallinity of the n cladding layer is insufficient.

During doping with Si as a dopant, when the dopant concentration is low, crystallinity increases, but resistance increases. When the dopant concentration of the n cladding layer increases, resistance is reduced, but the crystallinity is reduced.

As such, in a case in which the crystallinity of the n cladding layer is reduced, when a light emitting layer (MQW layer) or a p-type semiconductor layer is grown on the surface of the n cladding layer in the second growth chamber in the subsequent step, the crystallinity of these layers is reduced. Therefore, the product yield of an LED chip is reduced.

The invention has been made in view of the above-mentioned problems and an object of the invention is to provide a method for manufacturing a semiconductor light emitting element in which defects are less likely to occur in a light emitting layer and a p-type semiconductor layer due to the surface of an n cladding layer and which is capable of obtaining a high output.

In order to achieve the object, the invention provides the following means.

According to a first aspect of the invention, there is provided a method for manufacturing a semiconductor light emitting element including: a first step of forming a first n-type semiconductor layer on a substrate in a first metal organic chemical vapor deposition apparatus; and a second step of sequentially forming a regrowth layer of the first n-type semiconductor layer, a second n-type semiconductor layer, a light emitting layer, and a p-type semiconductor layer including a p cladding layer and a p contact layer on the first n-type semiconductor layer in a second metal organic chemical vapor deposition apparatus. In the step of forming the second n-type semiconductor layer, a step (1) of supplying Si less than that forming the regrowth layer as a dopant to form a first layer of the second n-type semiconductor layer and a step (2) of supplying Si more than that in the step (1) to form a second layer of the second n-type semiconductor layer are performed in this order.

According to a second aspect of the invention, in the method for manufacturing a semiconductor light emitting element according to the first aspect, the second layer of the second n-type semiconductor layer may be formed in a region that is at least 0 nm to 60 nm away from an interface with the light emitting layer.

According to a third aspect of the invention, in the method for manufacturing a semiconductor light emitting element according to the first or second aspect, the Si concentration of the first layer of the second n-type semiconductor layer may be in a range of $1\times10^{16}/cm^3$ to $5\times10^{17}/cm^3$, and the Si concentration of the second layer of the second n-type semiconductor layer may be in a range of $1\times10^{18}/cm^3$ to $2\times10^{19}/cm^3$.

According to a fourth aspect of the invention, in the method for manufacturing a semiconductor light emitting element according to any one of the first to third aspects, the Si concentration of an interface of the second layer of the second n-type semiconductor layer with the light emitting layer may be in a range of $1\times10^{18}/cm^3$ to $2\times10^{19}/cm^3$.

According to a fifth aspect of the invention, in the method for manufacturing a semiconductor light emitting element according to any one of the first to fourth aspects, in the step (1), the first layer of the second n-type semiconductor layer may be formed with a thickness of 10 nm to 100 nm. In the step (2), the second layer of the second n-type semiconductor layer may be formed with a thickness of 4 nm to 60 nm.

According to a sixth aspect of the invention, in the method for manufacturing a semiconductor light emitting element according to any one of the first to fifth aspects, in the step (1) and the step (2), a raw material gas for the second n-type semiconductor layer and a dopant gas including the Si may be supplied to form the second n-type semiconductor layer.

According to a seventh aspect of the invention, in the method for manufacturing a semiconductor light emitting element according to any one of the first to sixth aspects, the p contact layer may include a lower p contact layer and an upper p contact layer which are laminated. The Mg concentration of the lower p contact layer may be in a range of about $1\times10^{19}/cm^3$ to $1\times10^{20}/cm^3$, and the Mg concentration of the upper p contact layer may be in a range of about $2\times10^{20}/cm^3$ to $5\times10^{20}/cm^3$.

According to an eighth aspect of the invention, there is provided a semiconductor light emitting element including: a substrate; a first n-type semiconductor layer; a regrowth layer of the first n-type semiconductor layer; a second n-type semiconductor layer; a light emitting layer; and a p-type semiconductor layer including a p cladding layer and a p contact layer. The first n-type semiconductor layer, the regrowth layer, the second n-type semiconductor layer, the light emitting layer, and the p-type semiconductor layer may be sequentially formed on the substrate, and the second n-type semiconductor layer may be formed by laminating a first layer with a Si content less than that of the regrowth layer and a second layer with a Si content more than that of the first layer in this order.

According to a ninth aspect of the invention, in the semiconductor light emitting element according to the eighth aspect, the second layer of the second n-type semiconductor layer may be formed in a region that is at least 0 nm to 60 nm away from an interface with the light emitting layer.

According to a tenth aspect of the invention, in the semiconductor light emitting element according to the eighth or ninth aspect, the Si concentration of the first layer of the second n-type semiconductor layer may be in a range of $1\times10^{16}/cm^3$ to $5\times10^{17}/cm^3$, and the Si concentration of the second layer of the second n-type semiconductor layer may be in a range of $1\times10^{18}/cm^3$ to $2\times10^{19}/cm^3$.

According to an eleventh aspect of the invention, in the semiconductor light emitting element according to any one of the eighth to tenth aspects, the Si concentration of an interface of the second layer of the second n-type semiconductor layer with the light emitting layer may be in a range of $1\times10^{18}/cm^3$ to $2\times10^{19}/cm^3$.

According to a twelfth aspect of the invention, in the semiconductor light emitting element according to any one of the eighth to eleventh aspects, the first layer of the second n-type semiconductor layer may be formed with a thickness of 10 nm to 100 nm, and the second layer of the second n-type semiconductor layer may be formed with a thickness of 4 nm to 60 nm.

According to a thirteenth aspect of the invention, in the semiconductor light emitting element according to any one of the eighth to twelfth aspects, the p contact layer may include a lower p contact layer and an upper p contact layer which are laminated. The Mg concentration of the lower p contact layer may be in a range of about $1\times10^{19}/cm^3$ to $1\times10^{20}/cm^3$, and the Mg concentration of the upper p contact layer may be in a range of about $2\times10^{20}/cm^3$ to $5\times10^{20}/cm^3$.

According to a fourteenth aspect of the invention, a lamp includes the semiconductor light emitting element manufactured by the method for manufacturing the semiconductor light emitting element according to any one of the first to seventh aspects.

According to a fifteenth aspect of the invention, an electronic device includes the lamp according to the fourteenth aspect.

According to a sixteenth aspect of the invention, a mechanical apparatus includes the electronic device according to the fifteenth aspect.

According to the method for manufacturing a semiconductor light emitting element of the invention, in the step of forming the second n-type semiconductor layer in the second growth chamber (second metal organic chemical vapor deposition apparatus), the step (1) of supplying Si less than that forming the regrowth layer as the dopant to form the first layer of the second n-type semiconductor layer and the step (2) of supplying Si more than that in the step (1) as the dopant to form the second layer of the second n-type semiconductor layer can be performed in this order to change the amount of Si in the second n-type semiconductor layer.

In this way, it is possible to form the second n-type semiconductor layer in which the second layer with low resistance is formed on the first layer with high crystallinity. Therefore, the resistance of the second n-type semiconductor layer is reduced, the crystallinity thereof is improved, and the flatness of the surface thereof is improved. In this way, it is possible to grow a light emitting layer (MQW layer) or a p-type semiconductor layer with high crystallinity in the subsequent step. As a result, it is possible to improve the product yield of an LED chip and significantly improve productivity in terms of yield. In addition, since the second layer with low resistance is formed in the second n-type semiconductor layer, it is possible to diffuse a driving current. Therefore, it is possible to effectively prevent the concentration of light emitting positions even in a high-current LED.

DETAIL DESCRIPTION OF THE INVENTION

Figure 1:
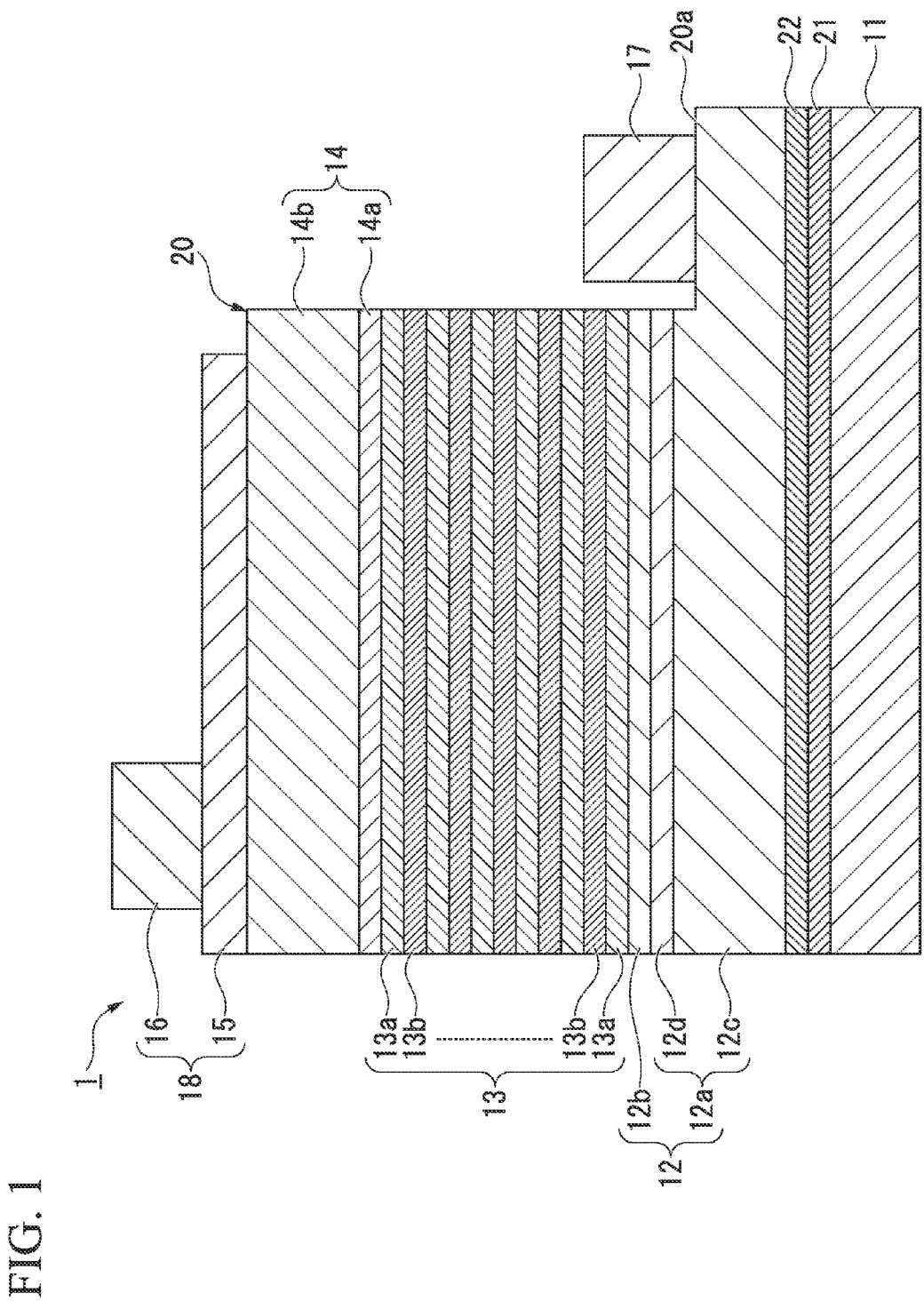
FIG. 1 is a schematic cross-sectional view illustrating an example of a semiconductor light emitting element manufactured by a method for manufacturing a semiconductor light emitting element according to the invention.

Hereinafter, a semiconductor light emitting element 1 according to the invention will be described in detail with reference to FIG. 1. In the drawings referred to in the following description, in some cases, characteristic portions are enlarged for convenience of illustration and the dimensions and scale of each component may be different from the actual dimensions and scale. In addition, for example, materials and methods exemplified in the following description are illustrative, but the invention is not limited thereto. The materials and methods may be appropriately changed without departing from the scope and spirit of the invention.

FIG. 1 is a schematic cross-sectional view illustrating an example of the semiconductor light emitting element 1 according to the invention.

The semiconductor light emitting element 1 according to this embodiment of the invention shown in FIG. 1 includes a substrate 11, a stacked semiconductor layer 20 that is formed on the substrate 11, a translucent electrode 15 that is formed on the upper surface of the stacked semiconductor layer 20, a p-type bonding pad electrode 16 that is formed on the translucent electrode 15, and an n-type electrode 17 that is formed on an exposed surface 20a of the stacked semiconductor layer 20.

The stacked semiconductor layer 20 is formed by sequentially forming an n-type semiconductor layer 12, a light emitting layer 13, and a p-type semiconductor layer 14 on the substrate 11 in this order. As shown in FIG. 1, a portion of each of the n-type semiconductor layer 12, the light emitting layer 13, and the p-type semiconductor layer 14 is removed by a method, such as etching, and a portion of the n-type semiconductor layer 12 is exposed from the removed portion. In addition, an n-type electrode 17 is formed on the exposed surface 20a of the n-type semiconductor layer 12.

The translucent electrode 15 and the p-type bonding pad electrode 16 are formed on the upper surface of the p-type semiconductor layer 14. The translucent electrode 15 and the p-type bonding pad electrode 16 form a p-type electrode 18.

The n-type semiconductor layer 12, the light emitting layer 13, and the p-type semiconductor layer 14 are preferably made of a group-III nitride semiconductor and more preferably made of a gallium-nitride-based compound semiconductor. In the invention, as the gallium-nitride-based compound semiconductor forming the n-type semiconductor layer 12, the light emitting layer 13, and the p-type semiconductor layer 14, semiconductors with various compositions represented by a general formula $Al_xIn_yGa_{1-x-y}N$ ($0 \le x < 1$, $0 \le y < 1$, $0 \le x+y < 1$) may be used without any limitation.

The semiconductor light emitting element 1 according to this embodiment is a face-up mounted light emitting element in which, when a current flows between the p-type electrode 18 and the n-type electrode 17, the light emitting layer 13 forming the stacked semiconductor layer 20 emits light and the light is emitted from the light emitting layer 13 to a side on which the p-type bonding pad electrode 16 is formed. The semiconductor light emitting element according to the invention may be a flip-chip-type light emitting element.

Next, the structure of each component will be described in detail.

(Substrate 11)

The substrate 11 may be made of, for example, sapphire, SiC, silicon, zinc oxide, magnesium oxide, manganese oxide, zirconium oxide, iron manganese zinc oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, or molybdenum. It is preferable that, particularly, a sapphire substrate having the c plane as the main surface be used as the substrate.

(Buffer Layer 21)

The buffer layer 21 may be not provided. However, it is preferable that the buffer layer 21 be provided since it reduces the difference between the lattice constants of the substrate 11 and the underlayer 22 and facilitates the formation of a C-axis oriented single-crystal layer on the (0001) C plane of the substrate 11. When a single-crystal underlayer 22 is formed on the buffer layer 21, it is possible to laminate the underlayer 22 with high crystallinity.

In particularly, it is preferable that the buffer layer 21 be made of monocrystalline $Al_xGa_{1-x}N$ ($0 \le x \le 1$). However, the buffer layer 21 may be made of polycrystalline $Al_xGa_{1-x}N$ ($0 \le x \le 1$).

The buffer layer 21 may be made of, for example, polycrystalline $Al_xGa_{1-x}N$ ($0 \le x \le 1$) and have a thickness of 0.01 μm to 0.5 μm. When the thickness of the buffer layer 21 is less than 0.01 in some cases, the effect of the buffer layer 21 reducing the difference between the lattice constants of the substrate 11 and the underlayer 22 is not sufficiently obtained. In addition, when the thickness of the buffer layer 21 is greater than 0.5 the function of the buffer layer 21 does not vary, but the deposition time of the buffer layer 21 increases, which results in a reduction in productivity.

The buffer layer 21 may have a polycrystalline structure or a monocrystalline structure. When the buffer layer 21 with the polycrystalline structure or the monocrystalline structure is formed on the substrate 11 by an MOCVD method or a sputtering method, the group-III nitride semiconductor formed on the buffer layer 21 becomes a crystal film with high orientation and crystallinity since the buffer function of the buffer layer 21 is effective.

(Underlayer 22)

It is preferable that the underlayer 22 be particularly made of $Al_xGa_{1-x}N$ ($0 \le x < 1$). In this case, it is possible to form the underlayer 22 with high crystallinity. However, the underlayer 22 may be made of $Al_xGa_yIn_zN$ ($0 \le x \le 1$, $0 \le y \le 1$, $0 \le z \le 1$, and $x+y+z=1$).

The thickness of the underlayer 22 is preferably equal to or greater than 0.1 μm, more preferably equal to or greater than 0.5 and most preferably equal to or greater than 1 μm. When the thickness is equal to or greater than the above-mentioned value, it is easy to obtain an $Al_xGa_{1-x}N$ layer with high crystallinity. In addition, it is preferable that the thickness of the underlayer 22 be equal to or less than 10 μm.

It is desirable that the underlayer 22 be doped with impurities in order to increase the crystallinity of the underlayer 22. However, when p-type or n-type conductivity is required, acceptor impurities or donor impurities may be added to the underlayer 22.

<Stacked Semiconductor Layer 20>

(N-Type Semiconductor Layer 12)

The n-type semiconductor layer 12 includes an n contact layer 12a (a first n-type semiconductor layer 12c and a regrowth layer 12d) and an n cladding layer 12b (second n-type semiconductor layer).

(N Contact Layer 12a)

The n contact layer 12a is for providing the n-type electrode 17 and includes a first n-type semiconductor layer 12c that is formed in a first step, which will be described below, and a regrowth layer 12d that is formed in a second step, which will be described below. The first n-type semiconductor layer 12c and the regrowth layer 12d are preferably made of the same material and the thickness of the first n-type semiconductor layer 12c is more than that of the regrowth layer 12d.

In this embodiment, as shown in FIG. 1, the exposed surface 20a for providing the n-type electrode 17 is formed on the first n-type semiconductor layer 12c. The exposed surface 20a for providing the n-type electrode 17 may be formed on the regrowth layer 12d.

The n contact layer 12a is preferably an $Al_xGa_{1-x}N$ layer ($0 \leq x < 1$, preferably $0 \leq x \leq 0.5$, and more preferably $0 \leq x \leq 0.1$) and is doped with n-type impurities (dopant). The concentration of the n-type impurities in the n contact layer 12a is $1 \times 10^{17}/cm^3$ to $1 \times 10^{20}/cm^3$ and preferably $1 \times 10^{18}/cm^3$ to $1 \times 10^{19}/cm^3$ in order to maintain good ohmic contact with the n-type electrode 17. The n-type impurities used in the n contact layer 12a are not particularly limited. However, for example, Si, Ge, or Sn may be used as the n-type impurities. Particularly, the n-type impurities are preferably Si and Ge, and most preferably Si. In this embodiment, the n contact layer 12a includes Si.

The thickness of the first n-type semiconductor layer 12c of the n contact layer 12a is preferably in the range of 0.5 μm to 5 μm and more preferably in the range of 2 μm to 4 μm. When the thickness of the first n-type semiconductor layer 12c is within the above-mentioned range, the crystallinity of the semiconductor is maintained at a high level. In addition, the first n-type semiconductor layer 12c includes about $5 \times 10^{18}/cm^3$ of Si as the n-type impurities (dopant).

The thickness of the regrowth layer 12d is preferably in the range of 0.05 μm to 2 μm and more preferably in the range of 0.2 μm to 1 μm.

If the thickness of the regrowth layer 12d is equal to or greater than 0.05 μm, it is possible to reduce influence on the crystallinity of the n contact layer 12a when the growth of the n contact layer 12a is stopped and is then taken out from the growth chamber and the growth of the n contact layer 12a is resumed in a growth chamber of another apparatus. Therefore, the effect of improving the output of the semiconductor light emitting element is noticeable.

When the thickness of the regrowth layer 12d is greater than 2 μm, a large amount of dopant or deposit remains in the growth chamber of a second metal organic chemical vapor deposition apparatus which is used to form the p-type semiconductor layer 14 after the n-type semiconductor layer 12 is formed and a defect is likely to occur in the p-type semiconductor layer 14 due to the dopant or the deposit used to form the n-type semiconductor layer 12. In addition, the deposition time of the regrowth layer 12d increases and productivity is reduced.

The regrowth layer 12d includes about $5 \times 10^{18}/cm^3$ of Si as the n-type impurities (dopant), similarly to the first n-type semiconductor layer 12c.

The n cladding layer 12b (second n-type semiconductor layer) is provided between the n contact layer 12a and the light emitting layer 13. The n cladding layer 12b is for injecting carriers into the light emitting layer 13 and for confining the carriers. The n cladding layer 12b also functions as a buffer layer of the light emitting layer 13 which reduces the crystal lattice mismatch between the regrowth layer 12d and the light emitting layer 13. In addition, the n cladding layer 12b may be made of, for example, AlGaN, GaN, or GaInN. In the specification, in some cases, the n cladding layer 12b is made of AlGaN or GaInN, considering the composition rate of each element. When the n cladding layer 12b is made of GaInN, it is preferable that the bandgap of GaInN be more than that of GaInN in the light emitting layer 13.

The n cladding layer 12b may have a single-layer structure or a superlattice structure. When the n cladding layer 12b has the single-layer structure, the thickness of the n cladding layer 12b is preferably in the range of 5 nm to 500 nm and more preferably in the range of 5 nm to 100 nm.

In this embodiment, the n cladding layer 12b (second n-type semiconductor layer) includes a first layer with a Si content less than that of the regrowth layer 12d and a second layer with a Si content more than that of the first layer which are laminated in this order.

The thickness of the first layer of the second n-type semiconductor layer is preferable in the range of 10 nm to 100 nm. When the thickness of the first layer of the second n-type semiconductor layer is less than 10 nm, the flatness of the surface of the n cladding layer 12b (second n-type semiconductor layer) is insufficient, which is not preferable. When the thickness of the first layer of the second n-type semiconductor layer is greater than 100 nm, the resistance of the n cladding layer 12b (second n-type semiconductor layer) increases. Therefore, the driving voltage Vf of the light emitting element increases and the light emission power of the semiconductor light emitting element 1 is reduced.

It is preferable that the Si concentration of the first layer of the second n-type semiconductor layer be in the range of $1 \times 10^{16}/cm^3$ to $5 \times 10^{17}/cm^3$. When the Si concentration is greater than $5 \times 10^{17}/cm^3$, the crystallinity of the first layer of the second n-type semiconductor layer is reduced. Therefore, the light emission power of the semiconductor light emitting element 1 is reduced.

The second layer of the second n-type semiconductor layer is formed on the first layer of the second n-type semiconductor layer and is preferably formed in the range of at least 0 nm to 60 nm from an interface with the light emitting layer 13, which will be described below. That is, it is preferable that a layer with high Si concentration is formed on a portion of a layer with low Si concentration.

It is preferable that the thickness of the second layer of the second n-type semiconductor layer be in the range of 4 nm to 60 nm. When the thickness of the second layer of the second n-type semiconductor layer is less than 4 nm, the driving voltage Vf when a current flows to the second n-type semiconductor layer is not sufficiently low and the light emission power of the semiconductor light emitting element 1 is reduced. When the thickness of the second layer of the second n-type semiconductor layer is greater than 60 nm, the flatness of the surface of the second layer of the second n-type semiconductor layer is insufficient. Therefore, a light emitting layer (MQW layer) or a P-type semiconductor layer with high crystallinity cannot be formed on the second layer of the second n-type semiconductor layer and the light emission power of the semiconductor light emitting element 1 is reduced.

It is preferable that the Si concentration of the second layer of the second n-type semiconductor layer be in the range of $1 \times 10^{18}/cm^3$ to $2 \times 10^{19}/cm^3$. When the Si concentration of the second layer of the second n-type semiconductor layer is less than $1 \times 10^{18}/cm^3$, the driving voltage Vf when a current flows to the second n-type semiconductor layer is not sufficiently low. When the Si concentration is greater than $2 \times 10^{19}/cm^3$, crystallinity is reduced and the flatness of the surface is lowered, which is not preferable.

In particular, it is preferable that the Si concentration of the interface of the second layer of the second n-type semiconductor layer with the light emitting layer be in the range of $1 \times 10^{18}/cm^3$ to $2 \times 10^{19}/cm^3$ and be equal to or greater than that of the second layer of the second n-type semiconductor layer. It is preferable that the thickness of a layer with a Si concentration equal to or more than that of the second layer of the second n-type semiconductor layer be in the range of 4 nm to 40 nm. When the Si concentration of the interface of the second layer of the second n-type semiconductor layer with the light emitting layer increases, it is possible to increase the injection efficiency of carriers into the light emitting layer.

As such, in this embodiment, since the Si concentration of the first layer of the second n-type semiconductor layer is less than that of the regrowth layer and is preferably in the range of $1\times10^{16}/cm^3$ to $5\times10^{17}/cm^3$, the crystallinity of the first layer of the second n-type semiconductor layer is high. Therefore, the surface of the first layer of the second n-type semiconductor layer is flat. In addition, since the Si concentration of the second layer of the second n-type semiconductor layer is more than that of the first layer of the second n-type semiconductor layer, the resistance of the second layer of the second n-type semiconductor layer is less than that of the first layer of the second n-type semiconductor layer.

The second layer of the second n-type semiconductor layer has a Si concentration more than that of the first layer of the second n-type semiconductor layer, but has a small thickness in the range of 4 nm to 60 nm. Therefore, influence on the flatness of the surface of the second layer of the second n-type semiconductor layer is small. Thus, it is possible to sufficiently increase the flatness of the surface of the second n-type semiconductor layer (the second layer of the second n-type semiconductor layer).

As such, in this embodiment, the n cladding layer 12b (second n-type semiconductor layer) has a structure in which the second layer with low resistance is formed on the first layer with high crystallinity. In addition, a layer with high Si concentration may be formed in a portion of the n cladding layer 12b (second n-type semiconductor layer). Therefore, in a high-current LED, it is also possible to uniformly diffuse the driving current and effectively prevent the concentration of light emitting positions. In addition, it is possible to improve light emission power. This is particularly significantly effective in the high-current LED in which the light emitting position is likely to be concentrated.

In this embodiment, the n cladding layer 12b may be a single layer. However, it is preferable that the n cladding layer 12b have a superlattice structure in which 10 pairs (20 layers) to 40 pairs (80 layers) of two thin film layers with different compositions are repeatedly grown. When the n cladding layer 12b has the superlattice structure in which 20 or more thin film layers are laminated, it is possible to effectively reduce the crystal lattice mismatch between the regrowth layer 12d and the light emitting layer 13 and the effect of improving the output of the semiconductor light emitting element 1 is noticeable. However, when the number of thin film layers laminated is greater than 80, the superlattice structure is likely to be disarrayed, which may have an adverse effect on the light emitting layer 13. In addition, the deposition time of the n cladding layer 12b increases and productivity is reduced.

In addition, when the n cladding layer 12b has the superlattice structure, it is preferable that the n cladding layer 12b be a laminate of a first n-side layer made of a group-III nitride semiconductor and a second n-side layer made of a group-III nitride semiconductor with a composition different from that of the first n-side layer and it is more preferable that the n cladding layer 12b have a structure in which a plurality of first n-side layers and a plurality of second n-side layers are alternately laminated.

In this case, the first n-side layer and the second n-side layer forming the superlattice structure of the n cladding layer 12b may have an alternate structure of GaInN/GaN, an alternate structure of AlGaN/GaN, an alternate structure of GaInN/AlGaN, an alternate structure of GaInN/GaInN with different compositions (in the invention, the term "different compositions" means that elements have different composition ratios), or an alternate structure of AlGaN/AlGaN with different compositions. It is preferable that the first n-side layer and the second n-side layer have the alternate structure of GaInN/GaN or the alternate structure of GaInN/GaInN with different compositions.

The thickness of each of the first n-side layer and the second n-side layer is preferably equal to or less than 100 angstroms, more preferably equal to or less than 60 angstroms, even more preferably equal to or less than 40 angstroms, and most preferably in the range of 10 angstroms to 40 angstroms. When the thickness of the first n-side layer and/or the second n-side layer forming the superlattice layer is greater than 100 angstroms, a crystal defect is likely to occur, which is not preferable.

<Light Emitting Layer 13>

The light emitting layer 13 has a multiple quantum well structure in which a plurality of barrier layers 13a and a plurality of well layers 13b are alternately laminated. The number of layers laminated in the multiple quantum well structure is preferably from three to ten and more preferably from four to seven.

(Well Layer 13b)

It is preferable that the thickness of the well layer 13b be equal to or greater than 15 angstroms and equal to or less than 50 angstroms. When the thickness of the well layer 13b is within the above-mentioned range, it is possible to obtain high light emission power.

It is preferable that the well layer 13b be made of a gallium nitride-based compound semiconductor including In. The gallium nitride-based compound semiconductor including In is preferable since it emits high-intensity light in the blue wavelength range. In addition, the well layer 13b may be doped with impurities. In this embodiment, it is preferable to use Si as the dopant. It is preferable that the amount of dopant be in the range of about $1\times10^{16}$ cm$^{-3}$ to $1\times10^{17}$ cm$^{-3}$.

(Barrier Layer 13a)

It is preferable that the thickness of the barrier layer 13a be equal to or greater than 20 angstroms and less than 100 angstroms. When the thickness of the barrier layer 13a is too small, the small thickness hinders the upper surface of the barrier layer 13a from being planarized, and emission efficiency or aging characteristics deteriorate. When the thickness of the barrier layer 13a is too large, the driving voltage increases or emission efficiency is reduced. Therefore, it is more preferable that the thickness of the barrier layer 13a be equal to or less than 70 angstroms.

The barrier layer 13a may be made of InGaN with an In concentration less than that of InGaN forming the well layer, in addition to GaN or AlGaN. Among them, GaN is preferable.

The barrier layer 13a may be doped with impurities. In this embodiment, it is preferable that Si be used as the dopant. It is preferable that the amount of dopant be in the range of about $1\times10^{17}$ cm$^{-3}$ to $1\times10^{18}$ cm$^{-3}$.

<P-Type Semiconductor Layer 14>

The p-type semiconductor layer 14 generally includes a p cladding layer 14a and a p contact layer 14b. In addition, the p contact layer 14b may also serve as the p cladding layer 14a.

(P Cladding Layer 14a)

The p cladding layer 14a is for injecting carriers into the light emitting layer 13 and confining the carriers. The material forming the p cladding layer 14a is not particularly limited as long as it has a composition with bandgap energy more than that of the light emitting layer 13 and can confine the carriers in the light emitting layer 13. It is preferable that the p cladding layer 14a be made of $Al_xGa_{1-x}N$ ($0 \leq x \leq 0.4$). It is preferable that the p cladding layer 14a be made of AlGaN. In this case, it is possible to confine the carriers in the light emitting layer 13.

The thickness of the p cladding layer 14a is not particularly limited. However, the thickness of the p cladding layer 14a is preferably in the range of 1 nm to 400 nm and more preferably in the range of 5 nm to 100 nm. The p-type doping concentration of the p cladding layer 14a is preferably in the range of $1\times10^{18}/cm^3$ to $1\times10^{21}/cm^3$ and more preferably in the range of $1\times10^{19}/cm^3$ to $1\times10^{20}/cm^3$. When the p-type doping concentration is within the above-mentioned range, crystallinity is not reduced and a good p-type crystal is obtained. In addition, the p cladding layer 14a may have a superlattice structure in which thin films are laminated a plurality of times.

When the p cladding layer 14a has the superlattice structure, it may be a laminate of a first p-side layer made of a group-III nitride semiconductor and a second p-side layer made of a group-III nitride semiconductor with a composition different from that of the first p-side layer. When the p cladding layer 14a has the superlattice structure, it may include a structure in which a plurality of first p-side layers and a plurality of second p-side layers are alternately laminated.

The first p-side layer and the second p-side layer forming the superlattice structure of the p cladding layer 14a may have different compositions, for example, any compositions of AlGaN, GaInN, and GaN and may have an alternate structure of GaInN/GaN, an alternate structure of AlGaN/GaN, or an alternate structure of GaInN/AlGaN. In the invention, it is preferable that the first p-side layer and the second p-side layer have the alternate structure of AlGaN/AlGaN or AlGaN/GaN.

The thickness of each of the first p-side layer and the second p-side layer is preferably equal to or less than 100 angstroms, more preferably equal to or less than 60 angstroms, even more preferably equal to or less than 40 angstroms, and most preferably in the range of 10 angstroms to 40 angstroms. When the thickness of each of the first p-side layer and the second p-side layer forming the superlattice layer is greater than 100 angstroms, a crystal defect is likely to occur, which is not preferable.

Each of the first p-side layer and the second p-side layer may have a doped structure or a combination of the doped structure and an undoped structure. As the impurities to be doped, the known impurities can be applied to the above-mentioned material composition without any limitation. For example, when the superlattice structure having an alternate structure of AlGaN/GaN or an alternate structure of AlGaN/AlGaN with different compositions is used the p cladding layer, Mg is preferable as the impurities. In addition, the first p-side layer and the second p-side layer forming the superlattice structure may have the same composition of GaInN, AlGaN, or GaN and have a combination of a doped structure/an undoped structure.

(P Contact Layer 14b)

The p contact layer 14b is for providing a positive electrode. It is preferable that the p contact layer 14b be made of $Al_xGa_{1-x}N$ ($0 \leq x \leq 0.4$) in order to maintain high crystallinity and obtain good ohmic contact with a p ohmic electrode. It is preferable that the p contact layer 14b include p-type impurities (dopant) at a concentration of $1\times10^{18}/cm^3$ to $1\times10^{21}/cm^3$ and preferably $5\times10^{19}/cm^3$ to $5\times10^{20}/cm^3$ in order to maintain good ohmic contact, prevent the generation of cracks, and maintain high crystallinity. The p-type impurities are not particularly limited, but it is preferable that Mg be used as the p-type impurities.

The p contact layer 14b includes a lower p contact layer and an upper p contact layer which are laminated. In particular, it is preferable that the lower p contact layer include Mg at a concentration of about $1\times10^{19}/cm^3$ to $1\times10^{20}/cm^3$ and the upper p contact layer include Mg at a concentration of about $2\times10^{20}/cm^3$ to $5\times10^{20}/cm^3$. In this way, a portion (upper p contact layer) which comes into contact with the translucent electrode 15 includes Mg at high concentration and the surface of the portion is flat. Therefore, it is possible to improve the light emission power of the semiconductor light emitting element 1.

The thickness of the p contact layer 14b is not particularly limited. However, the thickness of the p contact layer 14b is preferably in the range of 10 nm to 500 nm and more preferably in the range of 50 nm to 200 nm. It is preferable that the thickness of the p contact layer 14b be within the above-mentioned range in order to improve light emission power.

(N-Type Electrode 17)

The n-type electrode 17 also serves as a bonding pad and is formed so as to come into contact with the n-type semiconductor layer 12 of the stacked semiconductor layer 20. Therefore, when the n-type electrode 17 is formed, at least a portion of the p-type semiconductor layer 14 and the light emitting layer 13 is removed to expose the n-type semiconductor layer 12 and the n-type electrode 17 which also serves as the bonding pad is formed on the exposed surface 20a of the n-type semiconductor layer 12. As the n-type electrode 17, various compositions or structures have been known and the known compositions or structures can be used without any limitation. The n-type electrode 17 can be provided by the means which has been commonly used in this technical field.

(Translucent Electrode 15)

The translucent electrode 15 is formed on the p-type semiconductor layer 14 and it is preferable that the contact resistance of the translucent electrode 15 with the p-type semiconductor layer 14 be small. In addition, it is preferable that the translucent electrode 15 ha high light transmittance in order to emit light from the light emitting layer 13 to the outside of the semiconductor light emitting element 1 with high efficiency. Furthermore, it is preferable that the translucent electrode 15 have high conductivity in order to uniformly diffuse a current over the entire surface of the p-type semiconductor layer 14.

For example, the translucent electrode 15 is made of a conductive oxide including any one of In, Zn, Al, Ga, Ti, Bi, Mg, W, and Ce or a translucent conductive material selected from a group including zinc sulfide or chrome sulfide. Examples of the conductive oxide include ITO (indium tin oxide ($In_2O_3$—$SnO_2$)), IZO (indium zinc oxide ($In_2O_3$—ZnO)), AZO (aluminum zinc oxide (ZnO—$Al_2O_3$)), GZO (gallium zinc oxide (ZnO—$Ga_2O_3$)), fluorine-doped tin oxide, and titanium oxide.

The translucent electrode 15 may have any structure including the known structure. The translucent electrode 15 may be formed so as to cover substantially the entire surface of the p-type semiconductor layer 14 and may be formed in a lattice shape or a tree shape with gaps.

(P-Type Bonding Pad Electrode 16)

The p-type bonding pad electrode 16 also serves as a bonding pad and is formed on the translucent electrode 15. As the p-type bonding pad electrode 16, various compositions or structures have been known and the known compositions or structures can be used without any limitation. The p-type bonding pad electrode 16 can be provided by the means which has been commonly used in this technical field.

The p-type bonding pad electrode 16 may be formed at any position on the translucent electrode 15. For example, the p-type bonding pad electrode 16 may be formed at a position which is furthest away from the n-type electrode 17 or it may be formed at the center of the semiconductor light emitting element 1. However, when the p-type bonding pad electrode 16 is formed at a position which is too close to the n-type electrode 17, a short circuit occurs between wires and between balls during bonding, which is not preferable.

The area of the p-type bonding pad electrode 16 is as large as possible in order to facilitate a bonding operation. However, the large area of the p-type bonding pad electrode 16 hinders the extraction of emitted light. For example, when the p-type bonding pad electrode 16 covers a large area more than half the area of a chip surface, the extraction of emitted light is hindered and the output is significantly reduced. On the other hand, when the area of the p-type bonding pad electrode 16 is too small, it is difficult to perform the bonding operation and product yield is reduced. Specifically, it is preferable that the area of the p-type bonding pad electrode 16 be slightly more than the diameter of a bonding ball. In general, the p-type bonding pad electrode 16 has a circular shape with a diameter of about 100 μm.

(Protective Layer)

A protective layer (not shown) is formed so as to cover the upper and side surfaces of the translucent electrode 15, the exposed surface 20*a* of the n-type semiconductor layer 12, the side surfaces of the light emitting layer 13 and the p-type semiconductor layer 14, and the side surfaces or peripheries of the n-type electrode 17 and the p-type bonding pad electrode 16. The formation of the protective layer makes it possible to prevent the infiltration of, for example, water into the semiconductor light emitting element 1 and the deterioration of the semiconductor light emitting element 1.

It is preferable that the protective layer be made of a material which has an insulating property and a transmittance of 80% or more in the wavelength range of 300 nm to 550 nm. For example, the protective layer may be made of silicon oxide ($SiO_2$), aluminum oxide ($Al_2O_3$), niobium oxide ($Nb_2O_5$), tantalum oxide ($Ta_2O_5$), silicon nitride ($Si_3N_4$), or aluminum nitride (AlN). Among them, $SiO_2$ and $Al_2O_3$ are more preferable since they facilitate the formation of a dense film in CVD deposition.

Next, a method for manufacturing the semiconductor light emitting element 1 will be described in detail with reference to the drawings.

The drawings referred to in the following description are for describing the invention. In the drawings, for example, the size, thickness, or dimensions of each component are different from the actual size, thickness, or dimensions in the semiconductor light emitting element 1.

Figure 2:
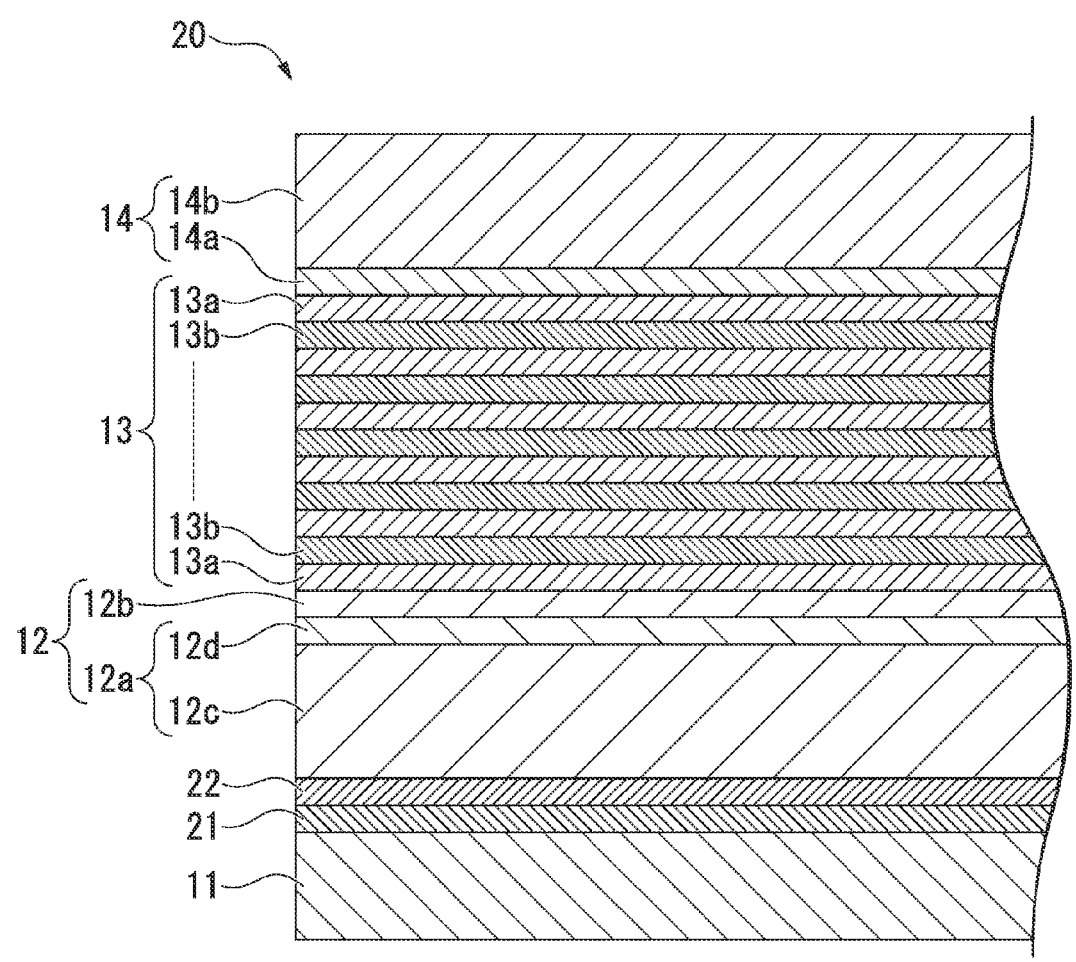
FIG. 2 is a schematic cross-sectional view illustrating a step of manufacturing the semiconductor light emitting element shown in FIG. 1.

In the method for manufacturing the semiconductor light emitting element 1 shown in FIG. 1 according to the invention, first, the stacked semiconductor layer 20 shown in FIG. 2 is manufactured. A method for manufacturing the stacked semiconductor layer 20 includes a first step of forming the first n-type semiconductor layer 12*c* on the substrate 11 and a second step of sequentially forming the regrowth layer 12*d* of the first n-type semiconductor layer 12*c*, the n cladding layer 12*b* (second n-type semiconductor layer), the light emitting layer 13, and the p-type semiconductor layer 14 on the first n-type semiconductor layer 12*c*. Next, each step will be described in detail with reference to FIG. 2.

<First Step>

First, the substrate 11 made of, for example, sapphire is prepared.

Then, the substrate 11 is placed in a growth chamber of a first MOCVD apparatus (first metal organic chemical vapor deposition apparatus) and the buffer layer 21 and the underlayer 22 are sequentially formed on the substrate 11 by an MOCVD method. In the invention, alternatively, the buffer layer 21 made of AlN may be formed on the substrate 11 made of, for example, sapphire by an RF sputtering method and then the underlayer 22 may be formed on the substrate in the growth chamber of the first MOCVD apparatus.

(Step of Forming First N-Type Semiconductor Layer 12*c* (First N-Type Semiconductor Layer))

Then, the first n-type semiconductor layer 12*c* forming a portion of the n contact layer 12*a* is formed on the substrate having the underlayer 22 formed thereon.

It is preferable that the temperature of the substrate 11 be in the range of 1000° C. to 1100° C. in a hydrogen atmosphere when the first step growth layer 12*c* is grown.

In addition, a group-III organic metal raw material, such as trimethyl gallium (TMG), or a nitrogen raw material, such as ammonium ($NH_3$), is used as the raw material for growing the first n-type semiconductor layer 12*c* and a group-III nitride semiconductor layer is deposited on the buffer layer by thermal decomposition. It is preferable that the internal pressure of the growth chamber of the MOCVD apparatus be in the range of 15 kPa to 80 kPa.

Then, the substrate 11 on which each layer up to the first n-type semiconductor layer 12*c* of the n contact layer 12*a* is formed is taken out from the growth chamber of the first MOCVD apparatus.

In the method for manufacturing the semiconductor light emitting element according to this embodiment, any substrate may be used in the first MOCVD apparatus as long as the first n-type semiconductor layer can be formed on the substrate by the MOCVD method. For example, the substrate 11 on which the buffer layer 21 and the underlayer 22 are sequentially formed is used.

<Second Step>

The second step includes a step of forming the regrowth layer 12*d* of the first n-type semiconductor layer 12*c* on the first n-type semiconductor layer 12*c*, a step of forming the n cladding layer 12*b* (second n-type semiconductor layer), a step of forming the light emitting layer 13, and a step of forming the p-type semiconductor layer 14. Next, each step will be described in detail.

(Step of Forming Regrowth Layer 12*d*)

First, the substrate 11 on which each layer up to the first n-type semiconductor layer 12*c* is formed is placed in a growth chamber of a second MOCVD apparatus (second metal organic chemical vapor deposition apparatus). Then, the regrowth layer 12*d* of the n contact layer 12*a* is formed on the first n-type semiconductor layer 12*c* by the MOCVD method.

In this embodiment, when the regrowth layer 12*d* is formed, a dopant gas including Si, such as $SiH_4$, is supplied together with a raw material gas to dope the regrowth layer 12*d* with Si. Here, the Si doping concentration is, for example, about $5 \times 10^{18}/cm^3$.

In this embodiment, before the regrowth layer 12*d* is formed, it is preferable that a heat treatment (thermal cleaning) be performed on the substrate 11 on which each layer up to the first n-type semiconductor layer 12*c* is formed in an atmosphere including nitrogen and ammonium at a temperature of 500° C. to 1200° C., preferably 800° C. to 1100° C., and more preferably 900° C. to 1000° C. As the heat treatment atmosphere, instead of the atmosphere including nitrogen and ammonium, for example, an atmosphere including only nitrogen may be used. In an atmosphere including only hydrogen, the first n-type semiconductor layer 12*c* is decomposed and crystallinity deteriorates, which is not preferable. In this case, the internal pressure of the growth chamber of the MOCVD apparatus is preferably in the range of 15 kPa to 100 kPa and more preferably in the range of 60 kPa to 95 kPa.

When the heat treatment is performed, after the first step, the substrate 11 on which each layer up to the first n-type semiconductor layer 12c of the n contact layer 12a is formed is taken out from the growth chamber of the first MOCVD apparatus. In this way, even when the surface of the first n-type semiconductor layer 12c is contaminated, it is possible to remove the contaminant before the regrowth layer 12d is formed. As a result, the crystallinity of the regrowth layer 12d is improved and the crystallinity of the n cladding layer 12b or the light emitting layer 13 formed on the regrowth layer 12d is further improved.

When the surface of the first n-type semiconductor layer 12c is contaminated, there is a concern that a reverse current (IR) will not be sufficiently small and electrostatic discharge (ESD) resistance will be insufficient. As a result, the reliability of the semiconductor light emitting element 1 is reduced.

In this embodiment, it is preferable that the growth conditions of the first n-type semiconductor layer 12c in the step of forming the first n-type semiconductor layer 12c be the same as those of the regrowth layer 12d in this step. In this case, it is possible to reduce influence on the crystallinity of the n contact layer 12a when two apparatuses, that is, the first MOCVD apparatus and the second MOCVD apparatus are used, the growth of the n contact layer 12a is stopped while the n contact layer 12a is being formed in the first MOCVD apparatus, the n contact layer 12a is taken out from the growth chamber and is then moved into the growth chamber of the second MOCVD apparatus, and the growth of the n contact layer 12a is resumed. Therefore, the crystallinity of the n contact layer 12a including the first n-type semiconductor layer 12c and the regrowth layer 12d is improved.

When the regrowth layer 12d is grown, the temperature of the substrate 11 is preferably in the range of 1000° C. to 1100° C. When the temperature of the substrate 11 is within the above-mentioned range during the growth of the regrowth layer 12d, it is possible to remove a contaminant during the formation of the regrowth layer 12d even when the substrate 11 on which each layer up to the first n-type semiconductor layer 12c is formed is taken out from the growth chamber of the first MOCVD apparatus and the surface of the first n-type semiconductor layer 12c of the n contact layer 12a is contaminated.

As a result, it is possible to further improve the crystallinity of the n cladding layer 12b or the light emitting layer 13 formed on the regrowth layer 12d in the step, which will be described below. On the other hand, when the temperature of the substrate 11 is less than 1000° C. during the growth of the regrowth layer 12d, there is a concern that the reverse current (IR) will not be sufficiently small or electrostatic discharge (ESD) resistance will be insufficient. When the temperature of the substrate 11 is more than 1000° C. during the growth of the regrowth layer 12d, there is a concern that the output of the semiconductor light emitting element 1 will be insufficient.

(Step of Forming N Cladding Layer 12b (Second N-Type Semiconductor Layer))

Then, the n cladding layer 12b is formed on the regrowth layer 12d.

In the step of forming then cladding layer 12b in this embodiment, a dopant gas including Si, such as SiH$_4$, is supplied together with a raw material gas for the n cladding layer 12b (second n-type semiconductor layer) into the second MOCVD apparatus. In this way, the n cladding layer 12b is doped with Si as a dopant.

The step of forming the n cladding layer 12b in this embodiment includes step (1) and step (2) in which different amounts of Si are supplied as the dopant. In this way, the n cladding layer 12b (second n-type semiconductor layer) is formed in which the first layer with a Si content less than that of the regrowth layer 12d and the second layer with a Si content more than that of the first layer of the second n-type semiconductor layer are laminated in this order.

It is particularly preferable that the Si concentration of interface of the second layer of the second n-type semiconductor layer with the light emitting layer be in the range of $1\times10^{18}/cm^3$ to $2\times10^{19}/cm^3$.

The n cladding layer 12b according to this embodiment may have a superlattice structure. In order to form a superlattice layer, 10 pairs (20 layers) to 40 pairs (80 layers) of two kinds of layers which have a thickness of 100 angstrom or less and different compositions are alternately laminated.

(Step of Forming Light Emitting Layer 13)

Then, the light emitting layer 13 with a multiple quantum well structure is formed. First, the well layers 13b and the barrier layers 13a are alternately laminated. In this case, it is preferable that the barrier layers 13a be laminated so as to be arranged on the sides of the n-type semiconductor layer 12 and the p-type semiconductor layer 14.

The compositions or thicknesses of the well layer 13b and the barrier layer 13a may be appropriately set such that a predetermined emission wavelength is obtained. In addition, the growth temperature of the light emitting layer 13 may be in the range of 600° C. to 900° C. and nitrogen gas may be used as the carrier gas.

(Step of Forming P-Type Semiconductor Layer 14)

The p-type semiconductor layer 14 may be formed by sequentially laminating the p cladding layer 14a and the p contact layer 14b. When the p cladding layer 14a includes a superlattice structure, first p-side layers which have a thickness of 100 angstroms or less and are made of a group-III nitride semiconductor and second p-side layers which have a thickness of 100 angstroms or less and are made of a group-III nitride semiconductor with a composition different from that of the first p-side layer are alternately laminated.

In particular, it is preferable that the p contact layer 14b be formed by laminating a lower p contact layer with a Mg concentration of about $1\times10^{19}/cm^3$ to $1\times10^{20}/cm^3$ and an upper p contact layer with a Mg concentration of about $2\times10^{20}/cm^3$ to $5\times10^{20}/cm^3$.

In this way, the stacked semiconductor layer 20 shown in FIG. 2 is manufactured.

Then, the translucent electrode 15 is formed on the p-type semiconductor layer 14 of the stacked semiconductor layer 20 and a portion of the translucent electrode 15 other than a predetermined region is removed by, for example, a generally known photolithography method.

Then, patterning is performed by, for example, the photolithography method to etch a portion of the stacked semiconductor layer 20 in a predetermined region such that a portion of the first n-type semiconductor layer 12c of the n contact layer 12a is exposed. Then, the n-type electrode 17 is formed on the exposed surface 20a of the n contact layer 12a.

Then, the p-type bonding pad electrode 16 is formed on the translucent electrode 15.

In this way, the semiconductor light emitting element 1 shown in FIG. 1 is manufactured.

<Lamp 3>

A lamp 3 according to this embodiment includes the semiconductor light emitting element 1 according to the invention and is formed by a combination of the semiconductor light emitting element 1 and a phosphor. The lamp 3 according to this embodiment may be formed to have a structure which has been known by those skilled in the art by the means which has been known by those skilled in the art. For example, in the lamp 3 according to this embodiment, a technique for combining the semiconductor light emitting element 1 with the phosphor to change the color of light emitted can be used without any limitation.

Figure 3:
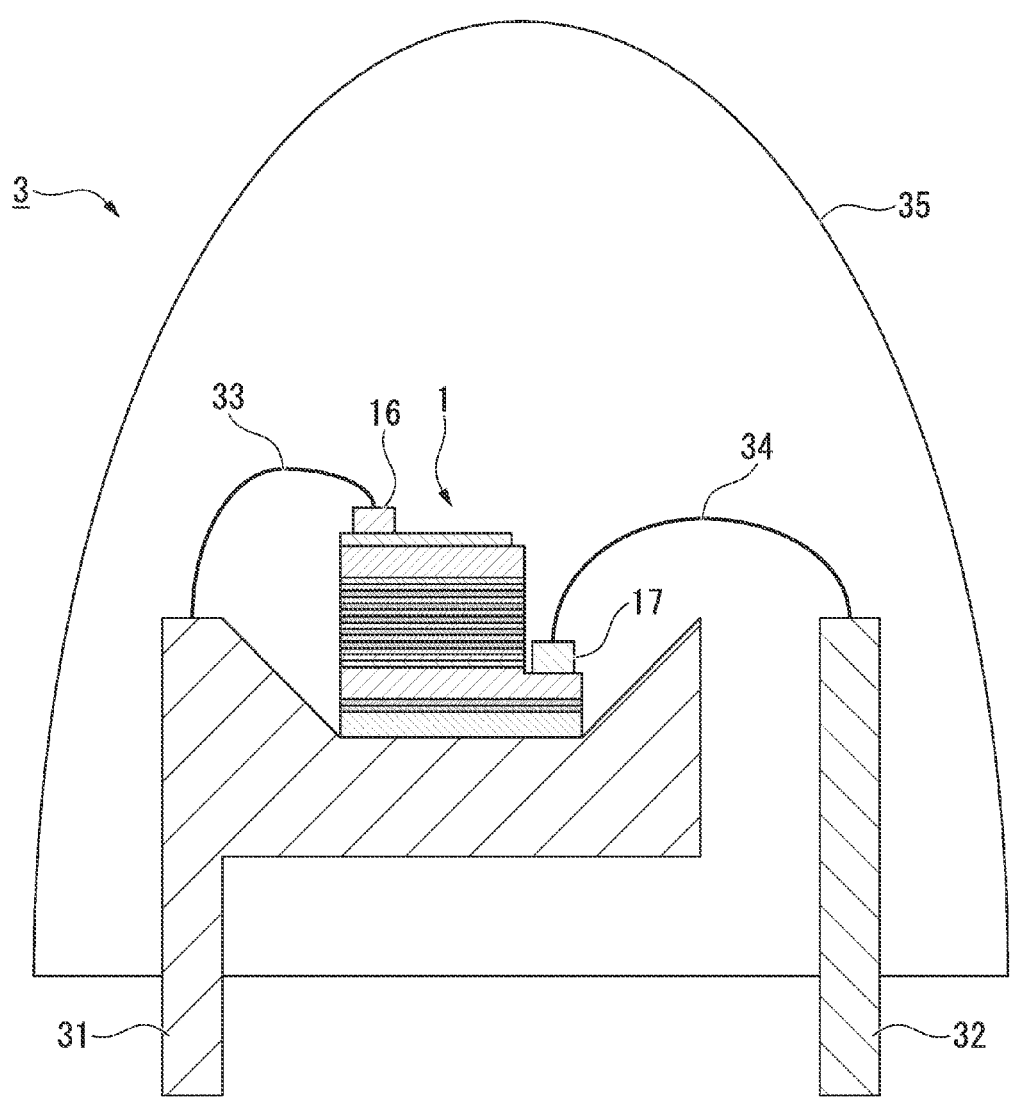
FIG. 3 is a schematic cross-sectional view illustrating an example of a lamp including the semiconductor light emitting element shown in FIG. 1.

FIG. 3 is a schematic cross-sectional view illustrating an example of the lamp including the semiconductor light emitting element 1 shown in FIG. 1. The lamp 3 shown in FIG. 3 has a shell shape and uses the semiconductor light emitting element 1 shown in FIG. 1. As shown in FIG. 3, the p-type bonding pad electrode 16 of the semiconductor light emitting element 1 is connected to one of two frames 31 and 32 (in FIG. 3, the frame 31) by a wire 33 and the n-type electrode 17 (bonding pad) of the semiconductor light emitting element 1 is connected to the other frame 32 by a wire 34. In this way, the semiconductor light emitting element 1 is mounted. In addition, the periphery of the semiconductor light emitting element 1 is sealed by a mold 35 made of a transparent resin.

Since the lamp 3 according to this embodiment uses the semiconductor light emitting element 1, it has high light emission power.

In addition, electronic devices, such as a backlight, a mobile phone, a display, various kinds of panels, a computer, a game machine, and an illuminator into which the lamp 3 according to this embodiment is incorporated, or mechanical apparatuses, such as vehicles into which the electronic devices are incorporated, include the semiconductor light emitting element 1 capable of obtaining high light emission power. In particular, the electronic devices, such as a backlight, a mobile phone, a display, a game machine, and an illuminator which are driven by batteries, can provide high-quality products with the semiconductor light emitting element 1 capable of obtaining high light emission power, which is preferable.

EXAMPLES

Next, the method for manufacturing the semiconductor light emitting element according to the invention will be described in detail with reference to examples, but the invention is not limited to the examples.

Example 1

The semiconductor light emitting element 1 shown in FIG. 1 was manufactured by the following method.

In the semiconductor light emitting element 1 according to Example 1, in a growth chamber of a first MOCVD furnace, a buffer layer 21 made of AlN, an underlayer 22 that had a thickness of 6 µm and was made of undoped GaN, and a first n-type semiconductor layer 12c that had a thickness of 2 µm and was made of Si-doped n-type GaN were formed on a substrate 11 made of sapphire.

Then, the substrate was taken out from the first MOCVD furnace and was then moved into a growth chamber of a second MOCVD furnace. Then, a heat treatment (thermal cleaning) was performed at 950° C. in an atmosphere including nitrogen and ammonium. Then, a regrowth layer 12d that had a thickness of 0.2 µm and was made of Si-doped n-type GaN was formed on the first n-type semiconductor layer 12c, thereby forming an n contact layer 12a with a thickness of 2.2 µm. The Si concentration of the n contact layer 12a including the first n-type semiconductor layer 12c and the regrowth layer 12d was about $5 \times 10^{18}/cm^3$.

The regrowth layer 12d was grown by using hydrogen as carrier gas and introducing TMG and $NH_3$ into the growth chamber. Monosilane ($SiH_4$) was used as n-type doping gas. In this case, the temperature of the substrate was 1080° C. and the internal pressure of the growth chamber was 40 kPa.

Then, an n cladding layer 12b (second n-type semiconductor layer) which had a superlattice structure with a thickness 80 nm and in which a first layer with a thickness of 20 nm and a second layer with a thickness of 60 nm were laminated was formed on the n contact layer 12a by a method, which will be described below. In addition, a GaN barrier layer with a thickness of 5 nm and a Si concentration of $1 \times 10^{17}/cm^3$ and a well layer that had a thickness of 3.5 nm and was made of undoped $In_{0.15}Ga_{0.85}N$ were formed on the n contact layer 12a five times. Finally, a light emitting layer 13 that had a multiple quantum well structure and was provided with a barrier layer was formed.

Then, a single p cladding layer 14a that had a thickness of 20 nm and was made of Mg-doped $Al_{0.07}Ga_{0.93}N$ and a p contact layer 14b that had a thickness of 170 nm and was made of Mg-doped p-type GaN were sequentially formed on the light emitting layer 13. The p contact layer 14b was a laminate of a lower p contact layer and an upper p contact layer. The lower p contact layer had a thickness 150 of nm a Mg concentration of $5 \times 10^{19}/cm^3$ and the upper p contact layer had a thickness of 20 nm and a Mg concentration of $3 \times 10^{20}/cm^3$.

The n cladding layer 12b (second n-type semiconductor layer) including the first layer with a thickness of 20 nm and the second layer with a thickness of 60 nm was formed under the following growth conditions.

"Growth Conditions of N Cladding Layer 12b (Second N-Type Semiconductor Layer)"

The first layer of the second n-type semiconductor layer with a thickness of 20 nm was formed by alternately and repeatedly growing five pairs of thin film layers each having a first n-side layer that was made of $Ga_{0.99}In_{0.01}N$ and had a thickness of 2 nm and a second n-side layer that was made of GaN and had a thickness of 2 nm. The carrier concentration was $1 \times 10^{17}/cm^3$.

Then, the second layer of the second n-type semiconductor layer with a thickness of 60 nm was formed by alternately and repeatedly growing fifteen pairs of thin film layers each having a first n-side layer that was made of $Ga_{0.99}In_{0.01}N$ and had a thickness of 2 nm and a second n-side layer that was made of GaN and had a thickness of 2 nm. However, the first n-side layer forming a portion of the second layer of the second n-type semiconductor layer come into contact with the upper surface of the first layer of the second n-type semiconductor layer. The carrier concentration was $1 \times 10^{18}/cm^3$.

The n cladding layer 12b having the superlattice structure with a thickness of 80 nm was grown by the above-mentioned method. In the growth of the first n-side layer, a triethylgallium (TEG), which was a Ga source, and trimethylindium (TMI), which was an In source, were used as a group-III raw material. In the growth of the second n-side layer, triethylgallium (TEG) was used.

In the formation of the n cladding layer 12b (second n-type semiconductor layer), $SiH_4$ gas and a raw material gas were supplied as an n-type dopant.

Then, a translucent electrode 15 that had a thickness of 200 nm and was made of ITO was formed on the p contact layer 14b by the generally known photolithography method.

Then, the photolithography method was used to perform etching, thereby forming an exposed surface 20a of the n contact layer 12a in a desired region. Then, an n-type electrode 17 with a two-layer structure of Ti/Au was formed on the exposed surface 20a.

In addition, a p-type bonding pad structure 16 with a three-layer structure of a metal reflecting layer that had a thickness of 200 nm and was made of Al, a barrier layer that had a thickness of 80 nm and was made of Ti, and a bonding layer that had a thickness of 1100 nm and was made of Au was formed on the translucent electrode 15 by the photolithography method.

In this way, the semiconductor light emitting element 1 according to Example 1 shown in FIG. 1 was obtained.

In the semiconductor light emitting element 1 according to Example 1 obtained in this way, the n cladding layer 12b (second n-type semiconductor layer) including the first layer and the second layer which were laminated was formed. Of the layers, the first layer of the second n-type semiconductor layer had a thickness of 20 nm and a Si content of $1\times10^{17}/cm^3$ and the second layer of the second n-type semiconductor layer had a thickness of 60 nm and a Si content of $7\times10^{18}/cm^3$. In this way, the second layer of the second n-type semiconductor layer was formed in a region that is 0 nm to 60 nm away from the interface with the light emitting layer 13. The interface of the second layer of the second n-type semiconductor layer with the light emitting layer 13 had a Si concentration of $7\times10^{18}/cm^3$.

The characteristics of the semiconductor light emitting element 1 were a forward voltage Vf of 3.0V, a light emission power Po of 24 mW, and a reverse current IR (@20 V) of 0.1 µA.

Example 2

The same operation as that according to Example 1 was performed except that the Si concentration of the second layer of the second n-type semiconductor layer according to Example 1 was changed to $1\times10^{19}/cm^3$ and the Si concentration of the interface of the second layer of the second n-type semiconductor layer with the light emitting layer 13 was changed to $1\times10^{19}/cm^3$. The characteristics of a semiconductor light emitting element 1 were a forward voltage Vf of 2.9V, a light emission power Po of 24 mW, and a reverse current IR (@20 V) of 0.2 µA.

Example 3

The same operation as that according to Example 1 was performed except that the first layer of the second n-type semiconductor according to Example 1 had a thickness of 40 nm and a Si concentration of $3\times10^{17}/cm^3$, the second layer of the second n-type semiconductor layer had a thickness of 40 nm and a Si concentration of $7\times10^{18}/cm^3$, and the Si concentration of the interface of the second layer of the second n-type semiconductor layer with the light emitting layer 13 was changed to $7\times10^{18}/cm^3$. The characteristics of a semiconductor light emitting element 1 were a forward voltage Vf of 3.0 V, a light emission power Po of 23 mW, and a reverse current IR (@20 V) of 0.1 µA.

Example 4

The same operation as that according to Example 1 was performed except that the thickness of the second layer of the second n-type semiconductor layer according to Example 1 was changed to 20 nm. The characteristics of a semiconductor light emitting element 1 were a forward voltage Vf of 3.1 V, a light emission power Po of 23 mW, and a reverse current IR (@20 V) of 0.1 µA.

Example 5

The same operation as that according to Example 1 was performed except that the superlattice structure of each of the first layer and the second layer of the second n-type semiconductor layer according to Example 1 was changed to a single-layer structure and the Si concentration of the interface of the second layer of the second n-type semiconductor layer with the light emitting layer 13 was changed to $1\times10^{19}/cm^3$. The characteristics of a semiconductor light emitting element 1 were a forward voltage Vf of 3.0 V, a light emission power Po of 23 mW, and a reverse current IR (@20 V) of 0.2 µA.

Comparative Example 1

The same operation as that according to Example 1 was performed except that the thickness and Si concentration of the first layer of the second n-type semiconductor layer according to Example 1 were changed to 80 nm and $5\times10^{18}/cm^3$, respectively and the thickness of the second layer of the second n-type semiconductor layer was 0 nm. The characteristics of a semiconductor light emitting element 1 were a forward voltage Vf of 3.2 V, a light emission power Po of 20 mW, and a reverse current IR (@20 V) of 1.0 µA. However, the superlattice structure of the first layer of the second n-type semiconductor layer was changed to a single-layer structure.

Table 1 shows the results of the forward voltage, light emission power (Po), and reverse current (IR) of the semiconductor light emitting elements according to Examples 1 to 5 and Comparative Example 1.

The forward voltage Vf of the semiconductor light emitting elements 1 according to Examples and Comparative Example is measured by applying a current of 20 mA to a probe. Similarly, the light emission power (Po) of the semiconductor light emitting elements 1 according to Examples and Comparative Example is measured as follows. Each of the semiconductor light emitting elements 1 is mounted on a TO-18 can package and a tester is used to apply a current of 20 mA, thereby measuring the light emission power. The reverse current (IR) is a value when a voltage of 20 V is applied to the terminal of the light emitting element in the reverse direction and a leakage current is measured.

TABLE 1

| | Thickness of first layer of second n-type semiconductor layer (nm) | Si concentration of first layer of second n-type semiconductor layer (cm$^{-3}$) | Thickness of second layer of second n-type semiconductor layer (nm) | Si concentration of second layer of second n-type semiconductor layer (cm$^{-3}$) | Si concentration of interface of second n-type semiconductor layer (cm$^{-3}$) | Forward voltage VF (V) | Light emission power (mW) | Reverse current (IR) @20 V (µA) |
|---|---|---|---|---|---|---|---|---|
| Example 1 | 20 | $1\times10^{17}$ | 60 | $7\times10^{18}$ | $7\times10^{18}$ | 3.0 | 24 | 0.1 |
| Example 2 | 20 | $1\times10^{17}$ | 60 | $1\times10^{19}$ | $1\times10^{19}$ | 2.9 | 24 | 0.2 |
| Example 3 | 40 | $3\times10^{17}$ | 40 | $7\times10^{18}$ | $7\times10^{18}$ | 3.0 | 23 | 0.1 |
| Example 4 | 20 | $1\times10^{17}$ | 20 | $7\times10^{18}$ | $7\times10^{18}$ | 3.1 | 23 | 0.1 |
| Example 5 | 20 | $1\times10^{17}$ | 60 | $7\times10^{18}$ | $1\times10^{19}$ | 3.0 | 23 | 0.2 |
| Comparative Example 1 | 80 | $5\times10^{18}$ | — | — | — | 3.2 | 20 | 1.0 |

As shown in Table 1, in all of the semiconductor light emitting elements 1 according to Examples 1 to 5, the reverse current (IR) was sufficient small, the forward voltage was relatively low, and the light emission power (Po) was equal to or more than 20 mW. Therefore, all of the semiconductor light emitting elements 1 had high brightness and low power consumption.

On the other hand, in Comparative Example 1 in which the n cladding layer 12*b* (second n-type semiconductor layer) had a thickness of 80 nm and a Si concentration of $5\times10^{18}/cm^3$, the light emission power (Po) was low, the forward voltage was relatively high, and the leakage current (reverse current (IR) was large, as compared to Examples 1 to 5.

In addition, in the semiconductor light emitting elements 1 according to Examples 1 to 5 and Comparative Example 1, power efficiency (%) {light emission power (mW)/(forward voltage (V)×applied current (mA))} was measured in the range of a current of 20 mA to 100 mA. The measurement result is shown in Table 2 and FIG. 4.

TABLE 2

| Lot | If (mA) | η (%) |
|---|---|---|
| Example 1 | 20 | 40.0% |
|  | 50 | 33.0% |
|  | 80 | 27.9% |
|  | 100 | 25.0% |
| Example 2 | 20 | 41.4% |
|  | 50 | 34.2% |
|  | 80 | 28.7% |
|  | 100 | 26.6% |
| Example 3 | 20 | 38.3% |
|  | 50 | 32.7% |
|  | 80 | 27.9% |
|  | 100 | 25.6% |
| Example 4 | 20 | 37.1% |
|  | 50 | 31.4% |
|  | 80 | 26.7% |
|  | 100 | 25.3% |
| Example 5 | 20 | 38.3% |
|  | 50 | 31.9% |
|  | 80 | 27.4% |
|  | 100 | 25.3% |
| Comparative example 1 | 20 | 31.3% |
|  | 50 | 24.7% |
|  | 80 | 21.0% |
|  | 100 | 19.2% |

Figure 4:
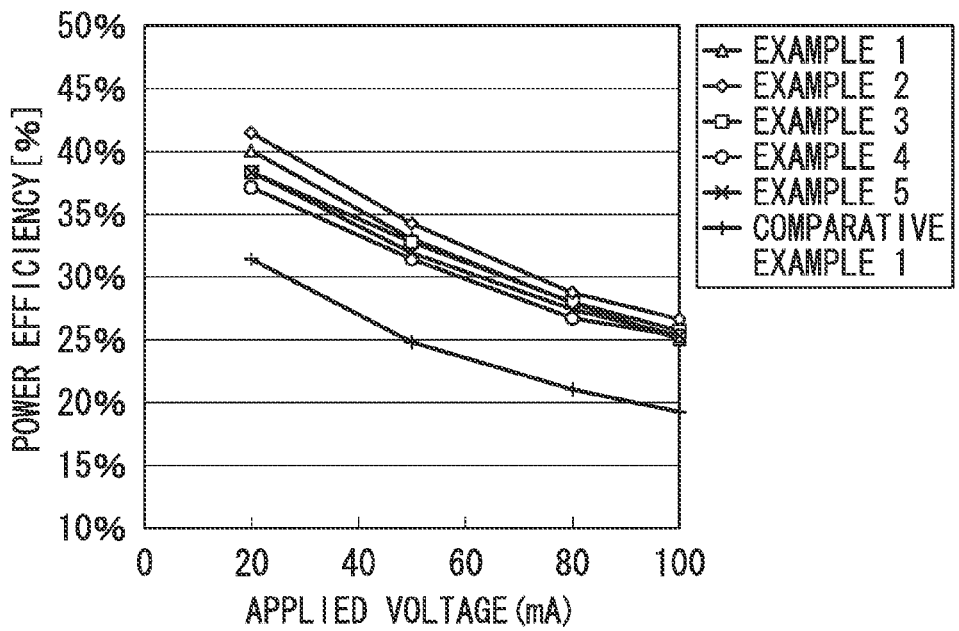
FIG. 4 is a graph illustrating the relationship between an applied current and power efficiency in semiconductor light emitting elements according to Examples 1 to 5 and Comparative Example 1.

As can be seen from Table 2 and FIG. 4, in Examples 1 to 5, power efficiency in the range of an applied current of 20 mA to 100 mA is more than that in Comparative example 1.

Figure 5:
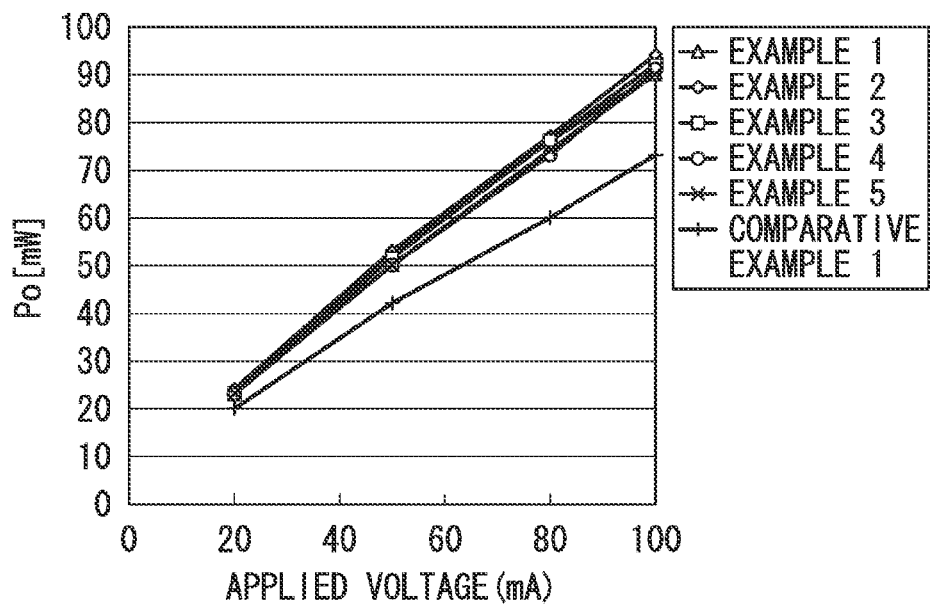
FIG. 5 is a graph illustrating the relationship between an applied current and light emission power in semiconductor light emitting elements according to Examples 1 to 5 and Comparative Example 1.

In the semiconductor light emitting elements 1 according to Examples 1 to 5 and Comparative Example 1, the light emission power (Po; mW) was measured in the range of an applied current of 20 mA to 100 mA. The measurement result is shown in FIG. 5. As can be seen from FIG. 5, in Examples 1 to 5, the light emission power (Po) in the range of an applied current of 20 mA to 100 mA is more than that in Comparative example 1.

In Comparative Example 1, the effect of improving the light emission power with an increase in the applied current is reduced as the applied current increases. As a result, as the applied current increases, a difference in light emission power (Po) between Examples 1 to 5 and Comparative example 1 increases.

As described above, it was ascertained that the semiconductor light emitting elements 1 according to Examples 1 to 5 could effectively improve the light emission power and a small leakage current and high light emission power were obtained, as compared to the semiconductor light emitting element 1 according to Comparative Example 1. In addition, it was ascertained that the application of a large current made it possible to effectively improve light emission power and obtain high light emission power, as compared to the semiconductor light emitting element according to Comparative Example 1.

REFERENCE SIGNS LIST

1: SEMICONDUCTOR LIGHT EMITTING ELEMENT
3: LAMP
12: n-TYPE SEMICONDUCTOR LAYER
12*a*: n CONTACT LAYER
12*b*: n CLADDING LAYER (SECOND n-TYPE SEMICONDUCTOR LAYER)
12*c*: FIRST n-TYPE SEMICONDUCTOR LAYER
12*d*: REGROWTH LAYER
13: LIGHT EMITTING LAYER
14: p-TYPE SEMICONDUCTOR LAYER

The invention claimed is:

1. A method for manufacturing a semiconductor light emitting element, comprising:
   a first step of forming a first n-type semiconductor layer on a substrate in a first metal organic chemical vapor deposition apparatus; and
   a second step of sequentially forming a regrowth layer of the first n-type semiconductor layer, a second n-type semiconductor layer, a light emitting layer, and a p-type semiconductor layer including a p cladding layer and a p contact layer on the first n-type semiconductor layer in a second metal organic chemical vapor deposition apparatus,
   wherein, in the step of forming the second n-type semiconductor layer, a step (1) of supplying Si less than that forming the regrowth layer as a dopant to form a first layer of the second n-type semiconductor layer and a step (2) of supplying Si more than that in the step (1) to form a second layer of the second n-type semiconductor layer are performed in this order.

2. The method for manufacturing a semiconductor light emitting element according to claim 1,
   wherein the second layer of the second n-type semiconductor layer is formed in a region that is at least 0 nm to 60 nm away from an interface with the light emitting layer.

3. The method for manufacturing a semiconductor light emitting element according to claim 1,
   wherein a Si concentration of the first layer of the second n-type semiconductor layer is in a range of $1\times10^{16}/cm^3$ to $5\times10^{17}/cm^3$, and a Si concentration of the second layer of the second n-type semiconductor layer is in a range of $1\times10^{18}/cm^3$ to $2\times10^{19}/cm^3$.

4. The method for manufacturing a semiconductor light emitting element according to claim 1,
   wherein an Si concentration of an interface of the second layer of the second n-type semiconductor layer with the light emitting layer is in a range of $1\times10^{18}/cm^3$ to $2\times10^{19}/cm^3$.

5. The method for manufacturing a semiconductor light emitting element according to claim 1,
   wherein, in the step (1), the first layer of the second n-type semiconductor layer is formed with a thickness of 10 nm to 100 nm, and
   in the step (2), the second layer of the second n-type semiconductor layer is formed with a thickness of 4 nm to 60 nm.

6. The method for manufacturing a semiconductor light emitting element according to claim 1, wherein, in the step (1) and the step (2), a raw material gas for the second n-type semiconductor layer and a dopant gas including the Si are supplied to form the second n-type semiconductor layer.

7. The method for manufacturing a semiconductor light emitting element according to claim 1,
wherein the p contact layer includes a lower p contact layer and an upper p contact layer which are laminated,
a Mg concentration of the lower p contact layer is in a range of about $1\times10^{19}/cm^3$ to $1\times10^{20}/cm^3$, and
a Mg concentration of the upper p contact layer is in a range of about $2\times10^{20}/cm^3$ to $5\times10^{20}/cm^3$.

8. A semiconductor light emitting element comprising:
a substrate;
a first n-type semiconductor layer;
a regrowth layer of the first n-type semiconductor layer;
a second n-type semiconductor layer;
a light emitting layer; and
a p-type semiconductor layer including a p cladding layer and a p contact layer,
wherein the first n-type semiconductor layer, the regrowth layer, the second n-type semiconductor layer, the light emitting layer, and the p-type semiconductor layer are sequentially formed on the substrate, and
the second n-type semiconductor layer is formed by laminating a first layer with a Si content less than that of the regrowth layer and a second layer with a Si content more than that of the first layer in this order.

9. The semiconductor light emitting element according to claim 8,
wherein the second layer of the second n-type semiconductor layer is formed in a region that is at least 0 nm to 60 nm away from an interface with the light emitting layer.

10. The semiconductor light emitting element according to claim 8,
wherein a Si concentration of the first layer of the second n-type semiconductor layer is in a range of $1\times10^{16}/cm^3$ to $5\times10^{17}/cm^3$, and a Si concentration of the second layer of the second n-type semiconductor layer is in a range of $1\times10^{18}/cm^3$ to $2\times10^{19}/cm^3$.

11. The semiconductor light emitting element according to claim 8,
wherein a Si concentration of an interface of the second layer of the second n-type semiconductor layer with the light emitting layer is in a range of $1\times10^{18}/cm^3$ to $2\times10^{19}/cm^3$.

12. The semiconductor light emitting element according to claim 8,
wherein the first layer of the second n-type semiconductor layer is formed with a thickness of 10 nm to 100 nm, and
the second layer of the second n-type semiconductor layer is formed with a thickness of 4 nm to 60 nm.

13. The semiconductor light emitting element according to claim 8,
wherein the p contact layer includes a lower p contact layer and an upper p contact layer which are laminated,
a Mg concentration of the lower p contact layer is in a range of about $1\times10^{19}/cm^3$ to $1\times10^{20}/cm^3$, and
a Mg concentration of the upper p contact layer is in a range of about $2\times10^{20}/cm^3$ to $5\times10^{20}/cm^3$.

14. A lamp comprising the semiconductor light emitting element manufactured by the method for manufacturing the semiconductor light emitting element according to claim 1.

15. An electronic device comprising the lamp according to claim 14.

16. A mechanical apparatus comprising the electronic device according to claim 15.

* * * * *